(12) United States Patent
Sunshine et al.

(10) Patent No.: US 11,146,871 B2
(45) Date of Patent: Oct. 12, 2021

(54) FABRIC-COVERED ELECTRONIC DEVICE

(71) Applicant: Apple Inc., Cupertino, CA (US)

(72) Inventors: Daniel D. Sunshine, Sunnyvale, CA (US); Kathryn P. Crews, Menlo Park, CA (US); Tirshathah A. Hunter, Oakland, CA (US); Kathleen A. Bergeron, Los Gatos, CA (US); Mingjing Ha, Cupertino, CA (US); Shubham A. Gandhi, Milpitas, CA (US); Paul S. Drzaic, Morgan Hill, CA (US); Yung-Yu Hsu, San Jose, CA (US); David W. Lum, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 566 days.

(21) Appl. No.: 16/140,409

(22) Filed: Sep. 24, 2018

(65) Prior Publication Data

US 2019/0313172 A1    Oct. 10, 2019

Related U.S. Application Data

(60) Provisional application No. 62/653,148, filed on Apr. 5, 2018.

(51) Int. Cl.
*H04R 1/02* (2006.01)
*G06F 1/16* (2006.01)
(Continued)

(52) U.S. Cl.
CPC .......... *H04R 1/023* (2013.01); *G06F 1/1605* (2013.01); *G06F 1/181* (2013.01); *G10L 15/20* (2013.01); *H04R 5/02* (2013.01)

(58) Field of Classification Search
CPC . H04R 1/00; H04R 1/02; H04R 1/023; H04R 1/028; H04R 5/02; H04R 3/00;
(Continued)

(56) References Cited

U.S. PATENT DOCUMENTS

| 5,870,485 A | 2/1999 | Lundgren et al. |
| 7,113,196 B2 | 9/2006 | Kerr |

(Continued)

FOREIGN PATENT DOCUMENTS

| CN | 1934302 A | 3/2007 |
| CN | 105981477 A | 9/2016 |

(Continued)

*Primary Examiner* — Thang V Tran
(74) *Attorney, Agent, or Firm* — Treyz Law Group, P.C.; G. Victor Treyz; Joseph F. Guihan

(57) ABSTRACT

An electronic device such as a voice-controlled speaker device may have a housing characterized by a vertical longitudinal axis. A flexible substrate such as a flexible mesh substrate with component support regions coupled by flexible segments may be wrapped around the housing and the vertical axis. The housing may have surface regions with compound curvature. The flexible substrate may conform to the regions with compound curvature. A fabric spacer layer may be interposed between the flexible substrate and the housing. Electrical components such as input-output devices may be mounted to the component support regions. A display may be formed from an array of light-emitting devices that are mounted on respective component support regions. Light from the light-emitting devices may pass through the fabric spacer layer toward the housing and back out away from the housing. An outer fabric layer may cover the mesh.

20 Claims, 9 Drawing Sheets

(51) Int. Cl.
*G10L 15/20* (2006.01)
*H04R 5/02* (2006.01)
*G06F 1/18* (2006.01)

(58) Field of Classification Search
CPC .......... G06F 1/16; G06F 1/1605; G06F 1/181; G10L 15/20
See application file for complete search history.

(56) References Cited

U.S. PATENT DOCUMENTS

| | | |
|---|---|---|
| 9,641,919 B1 | 5/2017 | Poole et al. |
| 9,659,577 B1 | 5/2017 | Langhammer |
| 9,721,586 B1 | 8/2017 | Bay et al. |
| 9,894,789 B1 | 2/2018 | Hamada et al. |
| 10,156,029 B1 * | 12/2018 | Podhajny ............. G06F 3/04883 |
| 10,273,600 B1 * | 4/2019 | Bharadwaj ......... G02F 1/134309 |
| 10,553,540 B2 * | 2/2020 | Sunshine ................ G01D 11/30 |
| 10,834,497 B2 * | 11/2020 | Stanley ..................... G06F 3/01 |
| 10,911,863 B2 * | 2/2021 | Trainer .................... H04R 7/18 |
| 10,989,868 B1 * | 4/2021 | Zou ........................ D21H 21/30 |
| 2010/0260370 A1 | 10/2010 | Chen et al. |
| 2016/0345086 A1 | 11/2016 | Chamberlin et al. |
| 2017/0005077 A1 | 1/2017 | Kim et al. |
| 2017/0068318 A1 * | 3/2017 | McClure ................ G06F 3/016 |
| 2017/0347214 A1 | 11/2017 | Kim |
| 2019/0026056 A1 * | 1/2019 | Wang .................... G06F 1/1613 |

FOREIGN PATENT DOCUMENTS

| | | |
|---|---|---|
| CN | 107037526 A | 8/2017 |
| CN | 206948606 U | 1/2018 |
| WO | P20170031153 A1 | 2/2017 |

\* cited by examiner

FABRIC-COVERED ELECTRONIC DEVICE

This application claims priority to U.S. provisional patent application No. 62/653,148 filed Apr. 5, 2018, which is hereby incorporated by reference herein in its entirety.

FIELD

This relates generally to electronic devices and, more particularly, to electronic devices with fabric.

BACKGROUND

Electronic devices such as voice-controlled assistant devices may include fabric. As an example, the housing of a voice-controlled assistant device may be covered with a layer of fabric. Openings may be provided in the fabric to allow sound to be emitted from within the device.

It may be challenging to enhance the functionality of a voice-controlled assistant device. For example, it may be difficult to integrated light-emitting devices into a voice-controlled assistant device with a fabric layer. If care is not taken, the fabric may impart an undesired appearance to emitted light or may block emitted light entirely, thereby preventing a light-emitting device from effectively conveying information to a user.

SUMMARY

An electronic device such as a voice-controlled speaker device may have a housing characterized by a vertical axis. The housing may have a cylindrical shape with upper and lower ends that have surface regions of compound curvature. The housing may be covered by a fabric layer such as a knit fabric layer with diamond-shaped openings.

A flexible substrate such as a flexible mesh substrate with component support regions that are coupled by flexible segments may be wrapped around the housing and the vertical axis. The flexible substrate may conform to the regions with compound curvature. The knit fabric layer may cover the flexible substrate.

A spacer fabric layer may be interposed between the flexible mesh substrate and the housing. Electrical components such as input-output devices may be mounted to the component support regions of the flexible mesh fabric. The input-output devices may include sensors and antennas and other wireless communications circuitry.

A display may be formed from an array of light-emitting devices that are mounted on respective component support regions in the flexible mesh substrate. The display may provide visual feedback as a user interacts with the electronic device by providing voice commands to the electronic device. In some configurations, the display may display images with text, moving content, icons, and other information.

The light-emitting devices may be configured so that light from the light-emitting devices passes inwardly through the fabric spacer layer toward the housing. A reflective layer such as a polymer layer that is configured to hide internal components from view may reflect the emitted light back through the fabric spacer layer. The electronic device may also be configured so that the light-emitting devices are oriented outwardly. Diffuser layers, reflective layers such as reflective acoustically transparent component hiding layers, adhesive layers, and/or other layers may also be incorporated into a stack of layers wrapped around the outer surface of the housing.

DETAILED DESCRIPTION

Figure 1:
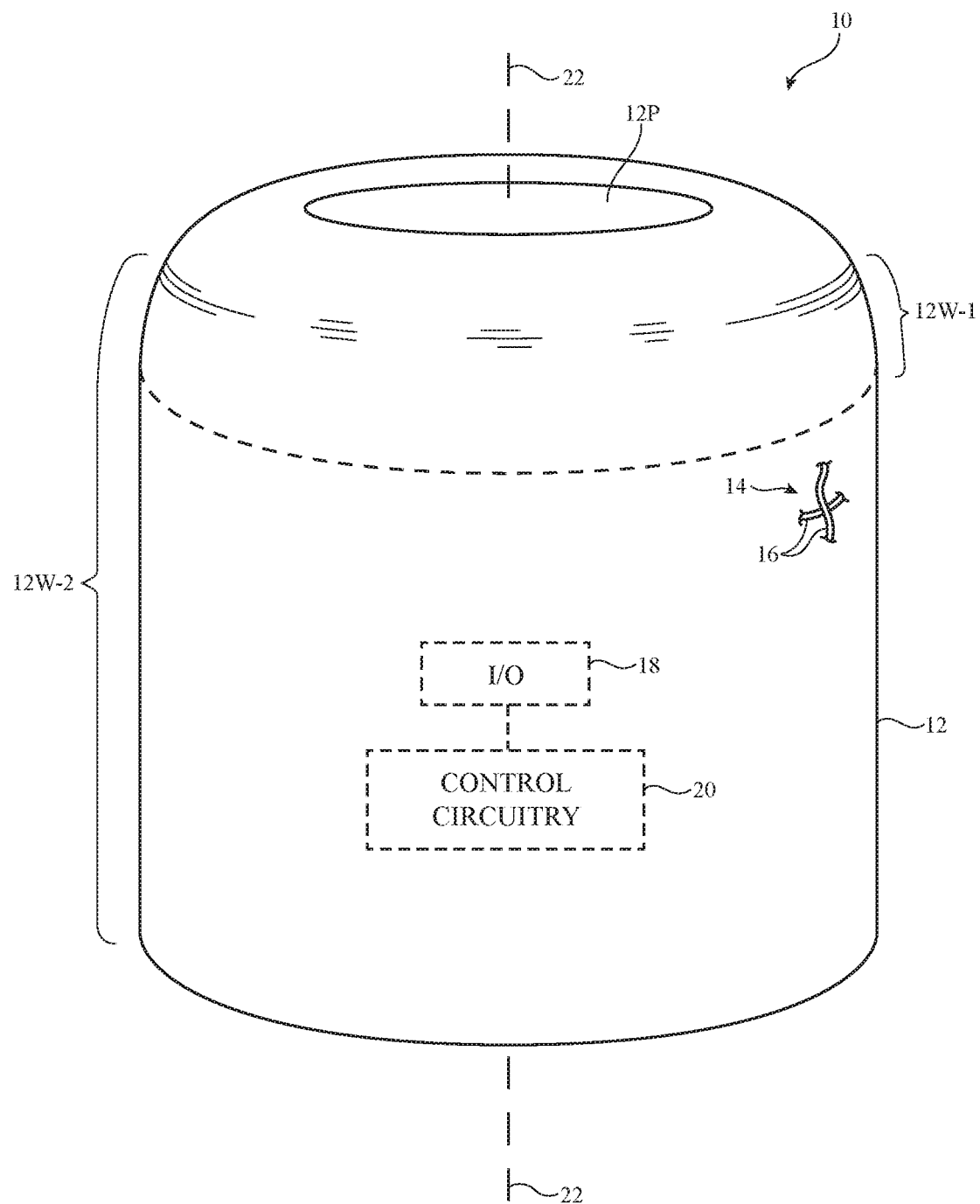
FIG. 1 is a perspective view of an illustrative voice-controlled electronic device having a housing covered with a fabric layer in accordance with an embodiment.

Items such as item 10 of FIG. 1 may include fabric. For example, fabric may be used in forming one or more covering layers for item 10 of FIG. 1. Item 10 may be an electronic device or an accessory for an electronic device such as a voice-controlled electronic device (sometimes referred to as a digital assistant or voice-controlled speaker), a laptop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which fabric-based item 10 is mounted in a kiosk, in an automobile, airplane, or other vehicle, other electronic equipment, or equipment that implements the functionality of two or more of these devices. If desired, item 10 may be a removable external case for electronic equipment, may be a strap, may be a wrist band or head band, may be a removable cover for a device, may be a case or bag that has straps or that has other structures to receive and carry electronic equipment and other items, may be a necklace or arm band, may be a wallet, sleeve, pocket, or other structure into which electronic equipment or other items may be inserted, may be part of a chair, sofa, or other seating (e.g., cushions or other seating structures), may be part of an item of clothing or other wearable item (e.g., a hat, belt, wrist band, headband, shirt, pants, shoes, etc.), or may be any other suitable fabric-based item. In the illustrative configuration of FIG. 1, item 10 is a voice-controlled electronic device such as a voice-controlled speaker with internet access. Other types of device may incorporate fabric, if desired.

As shown in FIG. 1, item 10 may include a housing such as housing 12. Housing 12 may have a cylindrical shape with rounded upper and lower ends of the type shown in FIG. 1 or other suitable shape (e.g., a pyramidal shape, a conical shape, a box shape such as a rectangular box shape, a spherical shape, etc.). Housing 12 may include support structures formed from metal, polymer, ceramic, glass, wood, other materials, and/or combinations of these materials. The shape of housing 12 may be selected to form an enclosure suited to the type of item 10 for which the housing is being used. As an example, in scenarios in which item 10 is a voice-controlled electronic device, housing 12 may be cylindrical, pyramidal, box-shaped, conical, spherical, or other shapes suitable for enclosing one or more speakers, in configurations in which item 10 is a laptop computer, housing 12 may have upper and lower thin box-shaped portions that are joined with a hinge and that can respectively house a display and a keyboard, in configurations in which item 10 is a computer monitor containing an embedded computer, housing 12 may have a slender box shape with optionally curved rear housing walls that can hold a display and be mounted on a stand, in configurations in which item 10 is a tablet computer, cellular telephone, media player, or other handheld or portable electronic device, housing 12 may have a rectangular outline and a thin depth, in configurations in which item 10 is a smaller device such as a wristwatch device or a pendant device, housing 12 may have a thin profile and an outline that is rectangular, square, hexagonal, triangular, oval, or circular, in configurations in which item 10 is a headphone or earpiece device, housing 12 may have a shape configured to fit on or in a user's ear, in configurations in which item 10 is a pair of eyeglasses or other equipment worn on a user's head, housing 12 may have a head-mountable shape, in configurations in which item 10 is a jacket or other item of clothing (e.g., a hat, belt, wrist band, headband, shirt, pants, shoes, etc.), housing 12 may be formed from layers of fabric or other material configured to allow item 10 to be worn on a user's body, in configurations in which item 10 is a television, a computer display that does not contain an embedded computer, a gaming device, or a navigation device, housing 12 may have a rectangular outline, an outline with curved sides and/or straight sides, a box shape, a cylindrical shape, and/or other suitable shapes, in configurations in which item 10 is a kiosk, housing 12 can form a pedestal or other shape suitable for a kiosk, in configurations in which item 10 forms part of an automobile, airplane, or other vehicle, housing 12 may form a dashboard, console, door, window, seat, body panel, or other portion of the vehicle, in configurations in which item 10 is a removable external case for electronic equipment, housing 12 may have the shape of a sleeve or other structure with a recess for receiving the electronic equipment, in configurations in which item 10 is a strap, wrist band, necklace or headband, housing 12 may have a strip shape, in configurations in which item 10 forms a case, bag, or wallet, housing 12 may have surfaces that form the walls of the case and/or sides of the bag or wallet and/or that forms straps and/or other structures for the case or bag, and in configurations in which item 10 is part of furniture, housing 12 may be configured to form a part of a chair, sofa, or other seating (e.g., cushions or other seating structures). In the illustrative configuration of FIG. 1, housing 12 has a cylindrical shape suitable for an item such as a voice-controlled speaker with internet access. Housing 12 may have other shapes and may be incorporated into other items, if desired. The configuration of FIG. 1 is presented as an example.

Item 10 may include fabric 14. Fabric 14 may form all or part of a housing wall or other layer in an electronic device, may form the outermost layer of item 10, may form one or more inner covering layers, may form internal structures in an electronic device, or may form other fabric-based structures. Item 10 may be soft (e.g., item 10 may have a fabric surface that yields to a light touch), may have a rigid feel (e.g., the surface of item 10 may be formed from a stiff fabric), may be coarse, may be smooth, may have ribs or other patterned textures, and/or may be formed as part of a device that has portions formed from non-fabric structures of plastic, metal, glass, crystalline materials, ceramics, or other materials. In an illustrative configuration, some or all of the upper surface of housing 12 such as portion 12P may be formed from rigid polymer or other non-fabric structure and the sidewall surfaces of housing 12 may be covered with fabric 14. Portion 12P may include touch sensors, light-emitting devices (e.g., light-emitting diodes that backlight button icons and/or that produce other visual output for a user), and/or other input-output components. If desired, fabric 12 may cover some or all of portion 12P. Fabric 14 may serve as a cosmetic cover for item 10 that overlaps audio components (microphones and/or speakers) and is permeable to sound and and/or may be incorporated into other portions of item 10.

Fabric 14 may include intertwined strands of material such as strands 16. Fabric 14 may, for example, include warp knit fabric that is formed by warp knitting of strands 16 and/or may include woven fabric, fabric with braided strands of material, etc. Strands 16 may be single-filament strands (sometimes referred to as fibers or monofilaments) or may be strands of material formed by intertwining multiple monofilaments of material together (sometimes referred to as yarns).

Strands 16 may be formed from polymer, metal, glass, graphite, ceramic, natural materials such as cotton or bamboo, or other organic and/or inorganic materials and combinations of these materials. Conductive coatings such as metal coatings may be formed on non-conductive material. For example, plastic strands in fabric 14 may be coated with metal to make them conductive. Reflective coatings such as metal coatings may be applied to make strands reflective. Strands formed from white polymer (e.g., light-scattering particles in polymer) and/or that are coated with white polymer may help reflect light in some configurations. If desired, strands may be formed from bare metal wires or metal wire intertwined with insulating monofilaments (as examples). Bare metal strands and strands of polymer covered with conductive coatings may be provided with insulating polymer jackets. In some configuration, strands 16 may include optical fibers (e.g., lossy optical fibers with surface roughening or other features that allow the strands to guide light while emitting portion of the guided light outwardly). Optical waveguide strands (e.g., lossy optical fibers formed from glass, transparent polymer, etc.) can be provided with light from light sources such as light-emitting diodes to display information (e.g., desired patterns of light). In some cases, it may be desirable for lossy fiber to appear dark or colored in reflection when illuminated by external light, so that the lossy fiber may match the appearance of other fibers. In these cases, the lossy fiber can include regions that are colored on the outside of the fiber but only leak light slightly or not at all and other regions that emit light due to roughen of the fiber surface or localized adjustments to the cladding of the fiber in that region (e.g., localized cladding thinning).

Items such as item 10 may, if desired, include control circuitry 20. Control circuitry 20 may include microprocessors, microcontrollers, application-specific integrated-circuits, digital signal processors, baseband processors, and/or other controllers and may include storage such as random-access memory, read-only memory, solid state drives, and/or other storage and processing circuitry.

Control circuitry 20 may gather information from sensors and other circuitry in input-output devices 18 and may use input-output devices 18 to supply output. Input-output devices 18 may, for example, include audio devices such as microphones and speakers. Microphones can gather audio input (e.g., sound that passes through fabric 14 such as voice commands for controlling the operation of item 10). Speakers can produce audio output (e.g., sound that passes through fabric 14). Sensors in input-output devices 18 may include touch sensors, force sensors, capacitive sensors, optical sensors, proximity sensors, strain gauges, temperature sensors, moisture sensors, gas sensors pressure sensors, magnetic sensors, position and orientation sensors (e.g., accelerometers, gyroscopes, and/or compasses), and/or other sensors. Light-emitting diodes, displays, and other visual output devices may be used in supply visual output to a user. As an example, visual output devices may be used to form illuminated buttons, displays that display images, visual feedback areas that display still and/or moving patterns of light to indicate to a user that a command has been received and/or is being processed by control circuitry 20, etc. Buttons, joysticks, haptic output components, and/or other input-output components may be provided in input-output devices 18 to gather input from a user and to provide a user with output. Wireless circuitry in circuitry 20 (e.g., wireless local area network circuitry, cellular telephone circuitry, etc.) may be used to support wireless communications with external equipment.

Light-emitting devices (e.g., lasers or light-emitting diodes) may be arranged in an array of pixels to form a display or other light-based output device. As an example, light-emitting devices may be formed under one or more covering layers (e.g., fabric) on item 10. The light-emitting devices may be formed just in a ring-shaped upper region 12W-1 that runs around the upper edge of item 10 and/or may be formed on one or more other portions of item 10 (e.g., on some or all of exterior sidewall surface 12W-2). In general, the surfaces of item 10 such as the surface of housing portion 12P and the sidewalls of item 10 may be provided with any suitable input-output devices 18. Sidewall locations in item 10 (e.g., the upper sidewall area associated with region 12W-1 and/or the sidewall areas associated with region 12W-2) may, as an example, be provided with light-emitting devices (e.g., to form a pixel array for displaying images that include text, still image content, moving image content, icons, etc.), may be provided with sensors (e.g., an array of force sensors, touch sensors, proximity sensors, gesture sensors, accelerometers for gathering touch/tap input, domes switches or other pressure-activated switches, etc.), and/or other input-output devices 18. These sidewall locations in item 10 may wrap partly or entirely around the periphery of item 10 (e.g., light-emitting devices, sensors, and/or other components may be provided on sidewall areas that wrap around a longitudinal axis of item 10 such as vertical axis 22 and extend along some or all of the circumference of item 10). Some or all of the surfaces of item 10 may be covered with one or more layers of material including fabric and/or other layer(s) such as polymer layers, metal layers, etc. If desired, light-emitting devices in item 10 may emit light in the infrared, which is invisible to the user, but can be detected by external sensors and devices to support light-based communication between item 10 and external devices. Item 10 may also include infrared light-detectors to support infrared light-based communications.

Figure 2:
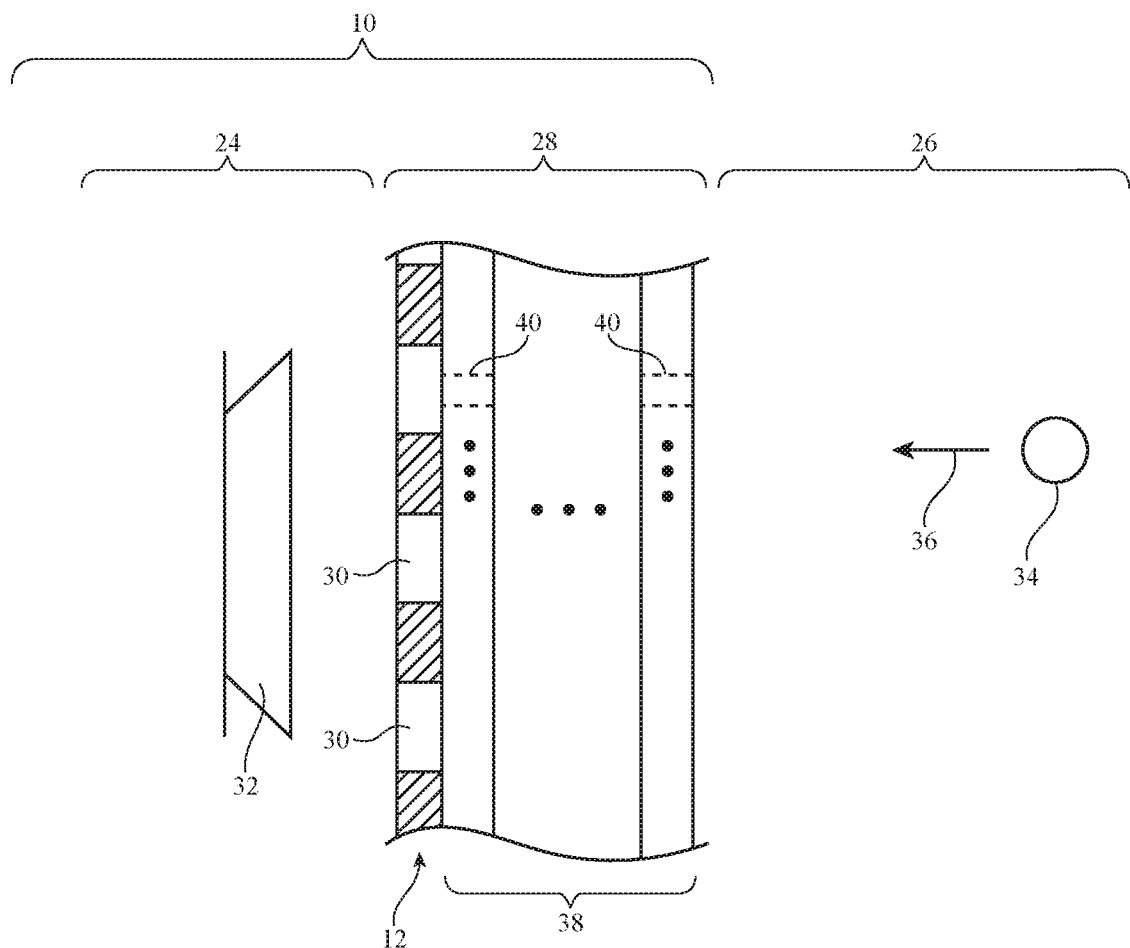
FIG. 2 is a cross-sectional side view of a portion of the device of FIG. 1 covered with illustrative layers of material in accordance with an embodiment.

A cross-sectional side view of a portion of item 10 is shown in FIG. 2. In the example of FIG. 2, item 10 includes internal components such as one or more speakers 32 in interior 24 of item 10. Wall structures 28 (e.g., sidewall structures) may separate interior 24 from exterior 26. A user of item 10 (e.g., user 34) may view the exterior of item 10 in direction 36 and may listen to sound that has been emitted from speaker 32 and that has passed through wall structures 28.

Wall structures 28 may include a housing formed from one or more rigid support structures (e.g., a metal housing wall, a plastic housing wall, a housing wall formed from other material and/or combinations of these materials). As shown in FIG. 2, for example, wall structures 28 may include housing 12 (e.g., a housing wall such as a housing sidewall and/or other housing wall structures). Housing 12 may have acoustic openings 30 to allow sound to pass through housing 12. Openings 30 may be circular, square, diamond-shaped, or may have other suitable shapes. The lateral dimensions of openings 30 may be at least 0.1 mm, at least 1 mm, at least 5 mm, at least 15 mm, less than 30 mm, less than 60 mm, or other suitable size.

Covering layers 38 may overlap the exterior surface of housing 12. Covering layers 38 may have openings 40. The outermost of covering layers 38 may, as an example, serve as a cosmetic layer (e.g., a layer that provides item 10 with a desired color, texture, etc.). Inner covering layers (e.g., layers 38 that are interposed between the outermost layer and housing 12) may include adhesive layers for attaching layers together, cushioning layers (e.g., layers of foam and/or fabric to provide layers 38 with a cushiony feel), component layers (e.g., substrates with electrodes, metal traces forming interconnects, integrated circuits, light-emitting components, sensors such as touch sensor arrays or force sensors, and/or other circuitry), light-modifying layers (e.g., diffuser layers, reflective layers, layers for hiding internal components from view, etc.), component-hiding layers or other layers such as acoustically transparent layers that block light and/or that block moisture, dust, and other environmental contaminants, and/or other covering layer structures. Layers 38 may, if desired, include coating layers (e.g., one or more layers of liquid polymer containing light-scattering particles, dye, pigment, and/or other materials that can be applied in liquid form and cured to form solid coatings, coating layers of metal or other materials deposited using physical vapor deposition, chemical vapor deposition, and/or electrochemical deposition, and/or other coatings.

One or more of layers 38 may include fabric 14. Fabric 14 may, for example, overlap some or all of the exterior of housing 12 (e.g., fabric 14 may overlap at least region 12W-2 of FIG. 1). Fabric 14 may also be used in forming straps, covers, wearable items, and/or other structures for item 10.

Figure 3:
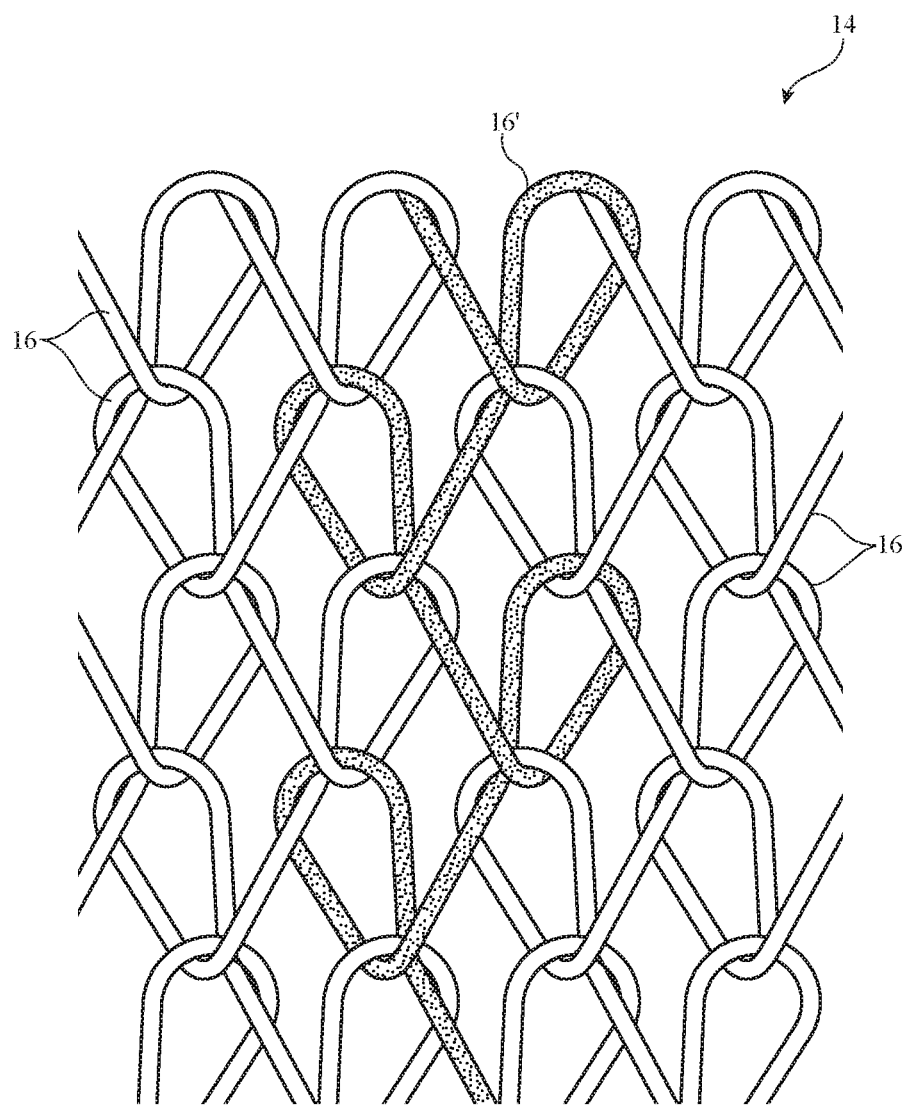
FIG. 3 is a diagram of a portion of an illustrative layer of warp knit fabric in accordance with an embodiment.

A warp knitting machine or other equipment (e.g., weaving equipment, braiding equipment, weft knitting equipment, etc.) may be used in intertwining strands 16 to form fabric 14. In general, fabric 14 may be any suitable type of fabric (e.g., woven fabric, knit fabric, braided fabric, etc.). A layer of illustrative warp knit fabric 14 is shown in FIG. 3.

An illustrative strand 16' among strands 16 has been highlighted to show the zig-zag path taken by each strand in fabric 14.

During the process of forming fabric 14 (e.g., during knitting), a warp knitting machine or other fabric fabrication equipment that is forming fabric 14 may, if desired, direct positioners in the equipment to incorporate openings into fabric 14. As an example, the equipment may be directed to form knit fabric or other fabric that includes diamond-shaped openings or openings of other suitable shapes, as illustrated by openings 42 in warp knit fabric 14 of FIG. 4. In configurations in which fabric 14 forms one of layers 38, openings 42 may serve as openings 40 of FIG. 2.

One or more of layers 38 of FIG. 2 may include a fabric layer or a polymer layer (e.g., a perforated polymer sheet) or other substrate layer with openings (e.g., openings that are sufficiently large to allow acoustic signals to pass). A polymer layer may, as an example, have a coating for reflecting and/or blocking light (e.g., one of layers 38 may be a polymer substrate and another of layers 38 may be a coating on the polymer substrate). In some configurations, metal traces and/or electrical components may be incorporated into a substrate. Flexible polymer substrates with metal traces (e.g., flexible layers of polyimide or other sheets of flexible polymer with metal traces) may sometimes be referred to as flexible printed circuits.

Figure 4:
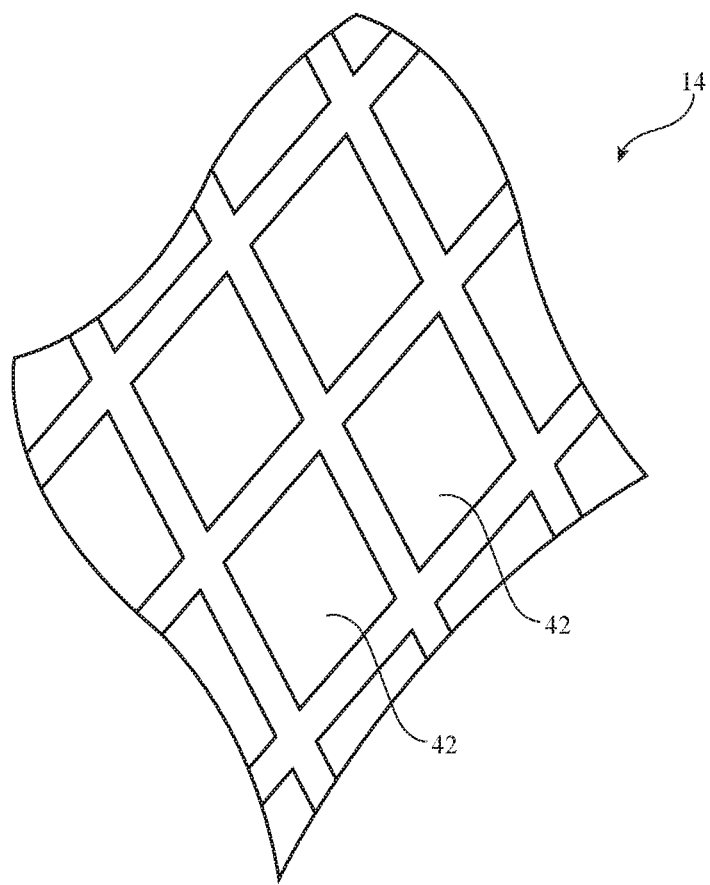
FIG. 4 shows how a layer of fabric may have openings such as diamond-shaped openings in accordance with an embodiment.
Figure 5:
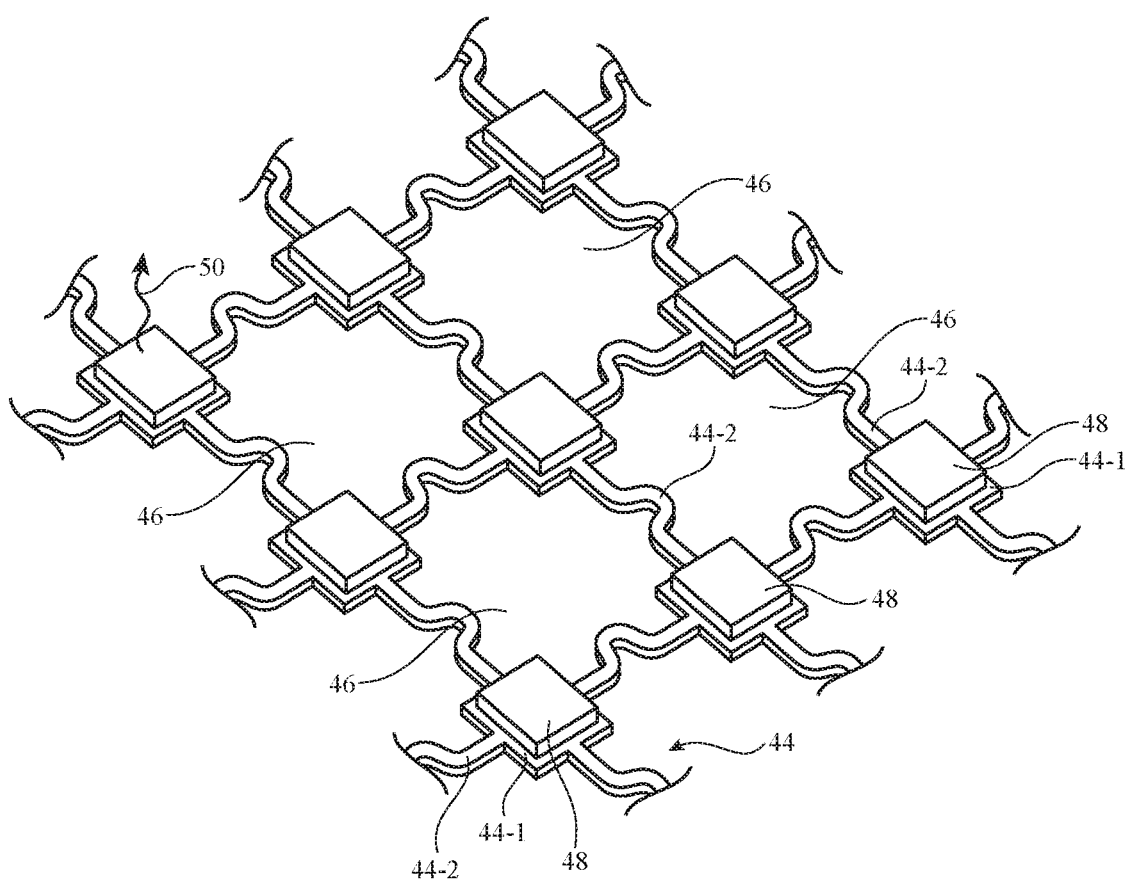
FIG. 5 is a perspective view of an illustrative mesh layer formed from a flexible printed circuit having an array of openings patterned to form component mounting areas interconnected with serpentine paths in accordance with an embodiment.

A perspective view of an illustrative flexible substrate layer with openings is shown in FIG. 5. Layer 44 of FIG. 5 may be a flexible printed circuit substrate or other substrate layer with an array of openings forming a mesh shape (sometimes referred to as a mesh layer, mesh, or flexible mesh). One or more layers such as mesh layer 44 of FIG. 5 may be included in layers 38 of FIG. 2. For example, one or more layers such as layer 44 of FIG. 5 may be interposed in layers 38 between an outer layer of fabric 14 (see, e.g., FIG. 4) and housing 12.

As shown in FIG. 5, layer 44 may have an array of openings 46. Layer 44 may have regions 44-1 (sometimes referred to as islands, island regions, component mounting areas, or component support regions) to which components 48 are soldered or otherwise mounted (see, e.g., the circuitry forming input-output devices 18 and/or control circuitry 20 of FIG. 1). Components 48 may be, for example, packaged or unpackaged semiconductor dies for forming integrated circuits, sensors, light-emitting devices, and/or other circuitry. With one illustrative configuration, components 48 are semiconductor dies forming one or more light-emitting devices such as light-emitting diodes or lasers (e.g., vertical cavity surface emitting lasers or other lasers) that emit light 50 (e.g., light 50 that exits layer 44 vertically, parallel to the surface normal of layer 44). Components 48 may also include sensors (e.g., capacitive touch sensors, etc.) and/or other input-output devices 18. If desired, a component 48 may include multiple semiconductor dies and/or other electrical components in a common package. For example, red, green, and blue light-emitting diodes and an optional control circuit and/or sensor circuits such as capacitive touch sensors can be placed in a common package. Electrostatic discharge protection circuitry can be incorporated into components 48 and/or the circuitry coupled to components 48 to help protected light-emitting diodes, touch sensors and other sensitive circuitry from electrical damage during electrostatic discharge events (e.g., when a user is touching the surface of item 10).

To enhance flexibility in mesh layer 44, regions 44-1 may be interconnected by elongated portions of layer 44 such as segments 44-2. Segments 44-2 may extend from one of regions 44-1 to another and may extend between openings 46. Segments 44-2 may be straight, may be curved, or may have both straight and curved portions. In the illustrative configuration of FIG. 5, segments 44-2 have serpentine shapes to help enhance the flexibility and stretchability of layer 44 without damaging layer 44 or components 48. Other mesh-shaped support structures may be used, if desired (e.g., mesh substrates with circular openings, triangular openings, hexagonal openings, mesh patterns with a combination of circular and square openings, meshes with non-regular patterns of openings, etc.). In some arrangements, layers 38 may include one or more layers such as layer 44 or other layers 38 (e.g., fabric layers) that serve to block internal components in housing 12 (e.g., speakers 32) from view by user 34 while allowing sound from speakers 32 to pass to user 34. These internal layers (which may sometimes be referred to as mesh layers or component-hiding layers) may be free of components 48. Coatings (e.g., white ink or other reflective coating layers) may be formed on the outwardly facing surfaces of the internal layer(s) to reflect light 50 outwardly (e.g., in scenarios in which one or more components 48 emit light 50 as shown in FIG. 5). As an example, a perforated flexible sheet of polymer may be coated with metal or a reflective white coating to reflect light 50 and/or a fabric with an array of openings and/or a coarse acoustically transparent structure may be provided with metalized strands, white strands, and/or reflective binder material to reflect light 50.

Figure 6:
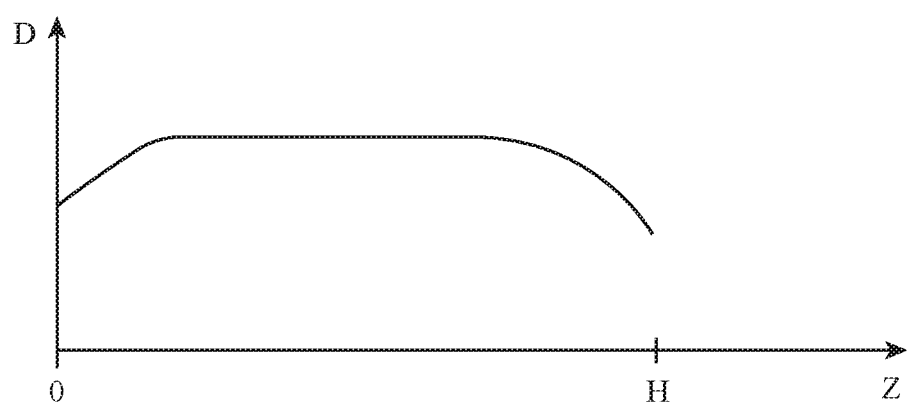
FIG. 6 is a graph showing how the density of components mounting areas on a flexible substrate and/or the density of other characteristics of the substrate may be varied as a function of position in accordance with an embodiment.

Housing 12 may have curved surfaces (e.g., surfaces with compound curvature as shown by the curved surfaces of item 10 of FIG. 1). Flexible substrates such as substrate 44 of FIG. 5 and other flexible layers 38 may have an array of openings 46 that is configured to help the layer(s) conform to the curved surfaces of housing 12. If desired, the density of openings 46 (e.g., the number, size, and/or shape of openings 46 per unit area) may be varied as a function of lateral distance across the surface of substrate 44 (or other flexible layer 38) when substrate 44 is in a planar configuration. As shown in FIG. 6, for example, the density of openings 46 may be decreased at the portions of layer 44 at the upper and lower ends of item 10 (e.g., near where vertical dimension Z is equal to 0 at the base of item 10 and where vertical dimension Z is equal to height H of item 10). For example, openings 46 may be larger (and components 48 spaced farther apart) on the portions of layer 44 that are to be coupled to the ends of item 10. When layer 44 is subsequently attached to the outer surface of housing 12, the lower-density portions of layer 44 will increase in density (because the spacing between portions of layer 44 will decrease as layer 44 laterally contracts when it conforms to the surfaces of housing 12 at the ends of item 10). As a result, following assembly of item 10 by attaching layer 44 to housing 12, components 48 that are located at the curved ends of item 10 will have an identical or nearly identical pitch (component-to-component spacing) as those components 48 that are located in the middle of item 10 (e.g., midway up the height of item 10).

Figure 7:
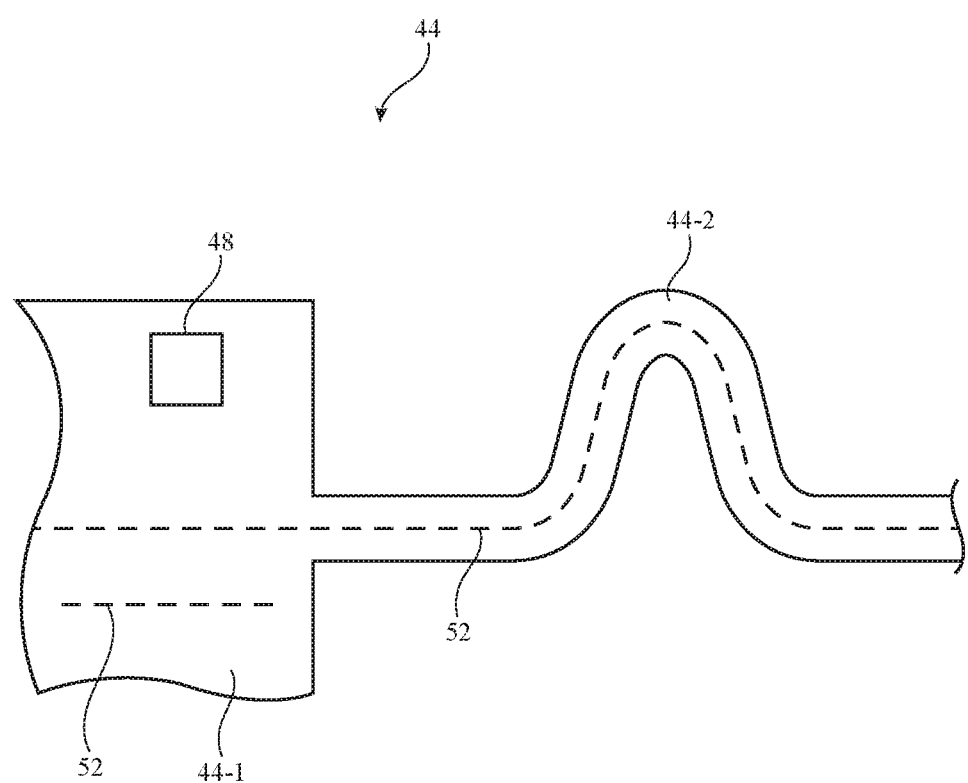
FIG. 7 is a top view of a portion of an illustrative mesh substrate layer in accordance with an embodiment.

FIG. 7 is a top view of layer 44 showing how structures such as metal traces 52 and components 48 may be formed on layer 44. Metal traces 52 and components 48 may, for example, be formed on component support regions 44-1. In some configurations, portions of metal traces 52 (and, if desired, circuit components) may extend onto segments 44-2. Metal traces 52 may be used in forming antennas, capacitive sensing electrodes for a capacitive touch sensor and/or capacitive proximity sensor, or electrodes for making other measurements such as force measurements, moisture measurements, temperature measurements, etc. Metal traces 52 can route signals between components 48 and can be used to interconnect components 48 with control circuitry 20. Components 48 may include light-emitting devices, sensor circuitry, haptic output components and other input-output circuitry (see, e.g., devices 18 of FIG. 1), and/or other circuitry in item 10.

Figure 8:
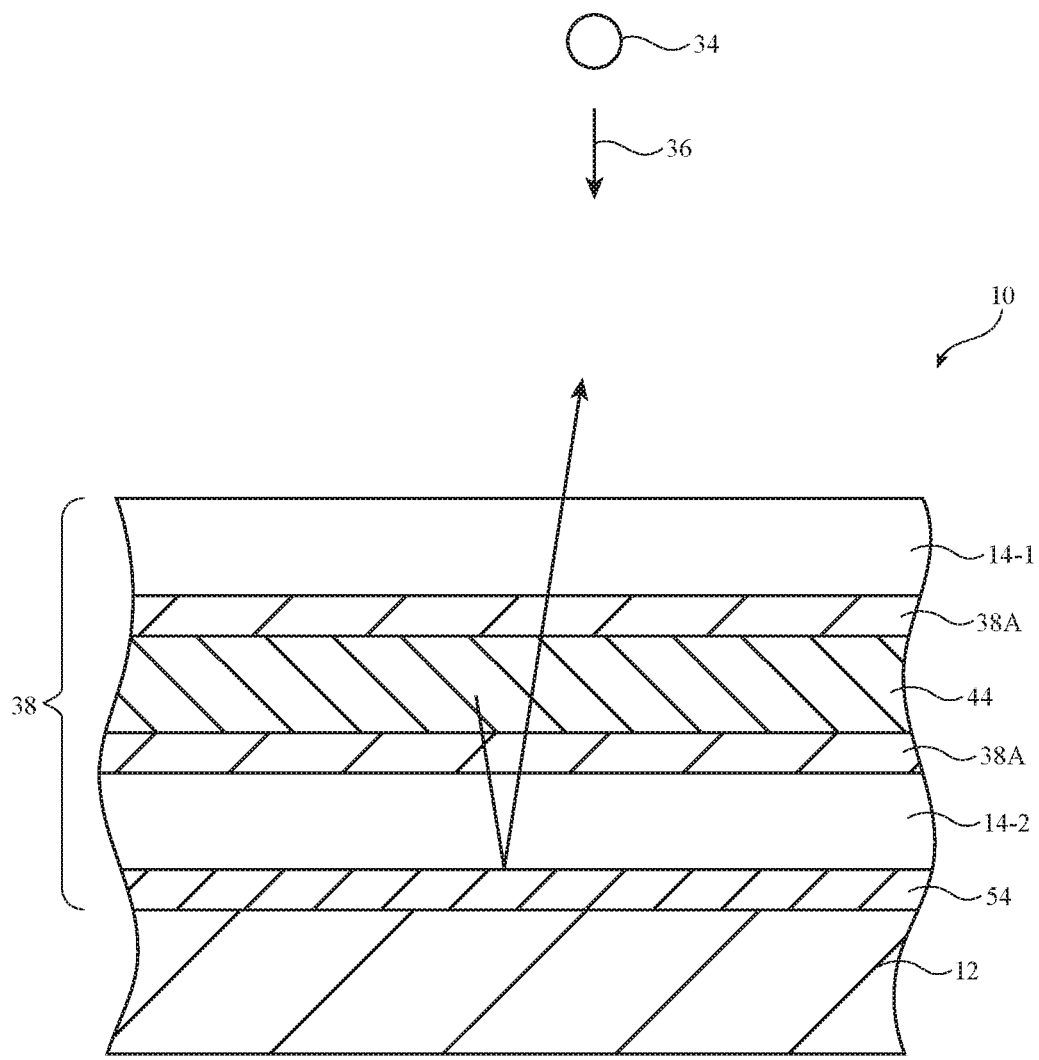
FIG. 8 is a cross-sectional side view of a portion of the device of FIG. 1 in accordance with an embodiment.

FIG. 8 is a cross-sectional side view of a portion of the sidewalls of item 10 showing how layers 38 may cover housing 12. Layers 38 may include layer 14-2 (e.g., a fabric spacer layer or other layer), layer 54 (e.g., an acoustically transparent component-hiding layer interposed between layer 14-2 and housing 12), adhesive layers 38A, layer 44 (e.g., a flexible printed circuit mesh layer such as layer 44 of FIG. 5 interposed between adhesive layers 38A), and layer 14-1 (e.g., a cosmetic fabric layer).

Layer 14-1 may be an outer cosmetic fabric layer such as layer 14 of FIG. 4. Openings 42 may be configured to allow sound to pass through layer 14-1. As shown in FIG. 8, other covering layers 38 may be interposed between outer layer 14-1 and housing 12.

Layer 54 may be a component-hiding layer such as a perforated polymer layer or a fabric layer formed from polymer strands or other strands of material. Layer 54 may help hide internal components in item 10 such as speaker 32 (FIG. 2) from view by users 34 as user 34 views item 10 in direction 36. The polymer of layer 54 may be provided with light-scattering particles and/or may be coated with a reflective coating (e.g., a polymer coating with light-scattering particles, a metal coating, etc.), so that layer 54 serves as a reflective acoustically transparent component-hiding layer that reflects light (e.g., a layer with a visible light reflectivity of at least 50%, at least 70%, at least 85%, less than 99.9%, etc.).

Fabric spacer layer 14-2 may be formed from a cushiony layer of fabric (e.g., an outer layer of fabric, an opposing inner layer of fabric, and a spacer layer formed from spacer strands that extend back and forth between the outer and inner fabric layers). Fabric spacer layer 14-2 may be sufficiently porous to allow sound to pass or may be provided with openings such as openings 42 of FIG. 4 to allow sound to pass.

Layer 44 may be interposed between an outer adhesive layer 38A and an inner adhesive layer 38A. Adhesive layers 38A may have openings that allow sound to pass. The outer layer of adhesive 38A may be used to attach layer 14-1 to layer 44. The inner adhesive layer 38A may be used to attach layer 44 to spacer fabric layer 14-2.

Layer 44 may be a flexible printed circuit such as layer 44 of FIG. 5. Layer 44 may include light-emitting components that emit light 50. For example, layer 44 may have light-emitting devices (components 48) that are configured to emit light 50 inwardly toward housing 12. The emitted light may be diffused by the strands of material in fabric spacer layer 14-2 as light 50 passes inwardly toward housing 12 and again as light 50 passes outwardly from housing 12 to users 34 after reflecting from reflective structures such as layer 54. Optional additional light diffusion layers may be included in layers 38, if desired. For example, one or more light diffusing layers may be located between housing 12 and layer 54, between layers 14-2 and 54, between layers 14-2 and 44, between layers 44 and 14-1 and/or in other locations in layers 38. In one illustrative configuration, a diffuser formed from a frosted polymer film may be interposed between one or more, two or more, or three or more of any of the interfaces between layers 38 of FIG. 8 to help diffuse light 50 as light 50 passes through the diffuser layer. In another illustrative configuration, layers 38 contains no frosted polymer films.

In general, light diffusing material, component-hiding material, dust-blocking material, additional flexible substrate(s) with electrical components, adhesive and/or coating structures (e.g., reflective coatings such as coatings of white ink, metal, etc.), may be located at one or more, two or more, or three or more of the interfaces between layers 38 of FIG. 8 and may be coupled to the outwardly facing and/or inwardly facing surfaces at each of these interfaces. If desired, a flexible mesh substrate such as layer 44 may include antenna traces (e.g., metal traces for forming patch antennas, inverted-F antennas, loop antennas, coils for inductive power transfer, monopoles, dipoles, etc.), metal traces forming capacitive sensor electrodes and/or signal interconnect traces, and/or other metal traces. Flexible mesh substrate layers in layers 38 such as layer 44 may also include electrical components such as components for forming input-output devices 18 and/or control circuitry 20 of FIG. 1. If desired, multiple layers such as layer 44 may be interposed in the stack of layer 38 in FIG. 8.

In some configurations, layer 44 may be located between layer 54 and housing 12 and/or between layer 14-2 and layer 54. In these arrangements, light 50 can be emitted outwardly towards user 34 and diffused while passing through layer 14-2 and/or through 54 and other layers 38 covering housing 12 and/or light 50 can be directed inwardly before reflecting outwardly through layer 14-2 and/or 54 and any other layers 38 covering housing 12.

Layer 44 may extend around the circumference of housing 12 (e.g., in a ring-shaped region such as region 12W-1 or region 12W-2 of FIG. 1. The density of light-emitting devices in layer 44 may be sufficient to form a display that is configured to display images for user 34 such as images containing text, graphics, moving images. In some configurations, the density of light-emitting devices on some or all of layer 44 may be low so that the light-emitting devices are used mainly for displaying diffuse fixed or moving patterns of light that serve as visual feedback (e.g., abstract light patterns of one or more colors).

Each component 48 may emit light for one or more pixels. The display formed by layer 44 may have any suitable number of pixels. For example, there may be an array of 11 by 128 pixels on layer 44 in region 12W-1 for forming a display with 1408 pixels. As another example, layer 44 may include an array of 128 by 71 pixels for forming a display with 8960 pixels in region 12W-2. In general, layer 44 may include at least 500 pixels, at least 1000 pixels, at least 2000 pixels, at least 5000 pixels, at least 9000 pixels, less than 10000 pixels, less than 50000 pixels, less than 400000 pixels, or other suitable number of pixels. Diffuse light emitted from item 10 may have a pleasing appearance and may help the emitted light to pass through fabric layer 14-1. The process of diffusing emitted light 50 may help item 10 produce a satisfactory output without using an excessive number of pixels.

Figure 9:
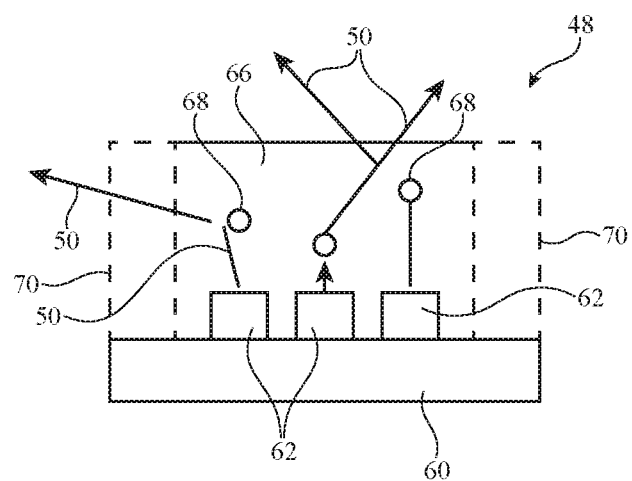
FIG. 9 is a cross-sectional side view of an illustrative component in accordance with an embodiment.
Figure 10:
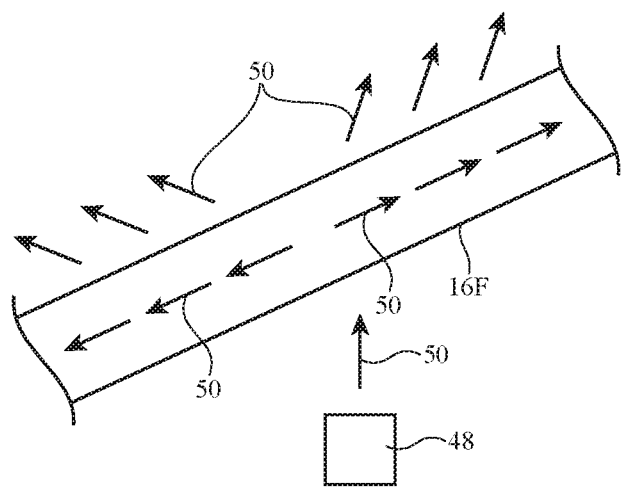
FIG. 10 is a side view of an illustrative light-emitting component such as a light-emitting diode emitting light that is coupled into and out of an associated lossy optical fiber in accordance with an embodiment.

FIG. 9 is a cross-sectional side view of component 48 in an illustrative configuration in which multiple light sources have been packaged in a common package. As shown in FIG. 9, component 48 may include a substrate such as substrate 60 (e.g., a printed circuit). Light-emitting diodes 62 and other electrical components (e.g., control circuits, touch sensors and other input devices, haptic output devices, etc.) can be mounted on substrate 60. For example, each components 48 may include a red light-emitting diode 62, a green light-emitting diode 62, and a blue light-emitting diode 62, thereby allowing component 48 to emit light of an adjustable color by adjusting the relative strengths of the red, green, and blue light emitted from diodes 62. Diodes 62 may be covered with polymer and/or other materials (e.g., for encapsulation, light diffusion, etc.). In the example of FIG. 9, diodes 62 are covered with a layer of polymer 66. Light-scattering particles 68 (e.g., high refractive index particles formed from titanium oxide or other inorganic materials, etc.) may be embedded in polymer 66 to scatter and thereby diffuse emitted light 50. If desired, optional sidewalls 70 may be included in the package for component 48. Sidewalls 70 may reflect emitted light 50 upwards and may thereby help concentrate emitted light 50 in a particular direction.

If desired, strands 16 in fabric 14 and/or elsewhere in item 10 may include optical fibers such as optical fiber 16F. Light 50 that is emitted from component 48 may be coupled into the interior of fiber 16F and may be guided within the interior of fiber 16F in accordance with the principal of total internal reflection. Fiber 16F may be a lossy fiber that tends to scatter and emit guided light along its length. As a result, light 50 that has been coupled into fiber 16F may be emitted and viewed by a user of item 10. If desired, light 50 may be launched into the ends of one or more fibers such as fiber 16F by coupling components to the ends of the fibers.

The foregoing is merely illustrative and various modifications can be made to the described embodiments. The foregoing embodiments may be implemented individually or in any combination.

What is claimed is:

1. An electronic device, comprising:
   a housing;
   a speaker in the housing configured to emit sound;
   a fabric layer having openings configured to allow the sound to pass; and
   a flexible substrate layer with an array of light-emitting devices that is interposed between the fabric layer and the housing and is configured to emit light towards the housing.

2. The electronic device defined in claim 1 wherein the housing is cylindrical and is characterized by a longitudinal axis and wherein the flexible substrate layer is configured to form a ring that wraps around the housing and the longitudinal axis.

3. The electronic device defined in claim 2 further comprising light-emitting devices configured to form pixels in a display under the fabric layer, wherein the flexible substrate layer has an array of substrate layer openings and is configured to form component support regions coupled by segments of the flexible substrate layer, and wherein each of the light-emitting devices is mounted on a respective one of the component support regions.

4. The electronic device defined in claim 3 further comprising a fabric spacer layer between the flexible substrate layer and the housing, wherein the light emitted toward the housing passes through the fabric spacer layer.

5. The electronic device defined in claim 4 wherein the fabric layer openings comprises diamond-shaped fabric layer openings.

6. The electronic device defined in claim 4 wherein the array of light-emitting devices includes at least 5000 of the light-emitting devices and wherein the array of light-emitting devices is configured to form a display that displays images.

7. The electronic device defined in claim 4 further comprising an acoustically transparent component-hiding layer interposed between the fabric spacer layer and the housing, wherein the acoustically transparent component-hiding layer is configured to reflect the light that passes through the fabric spacer layer back through the spacer layer away from the housing.

8. The electronic device defined in claim 1 wherein the flexible substrate layer forms a mesh onto which light-emitting devices are mounted.

9. The electronic device defined in claim 8 wherein the housing has regions with compound curvature and wherein the mesh conforms to the housing in the regions with compound curvature.

10. The electronic device defined in claim 1 wherein the flexible substrate layer forms a mesh with touch sensor circuitry.

11. A voice-controlled device, comprising:
    a housing having a housing wall;
    a speaker in the housing configured to emit sound;
    a flexible polymer mesh having openings configured to form component support regions coupled by flexible polymer segments, wherein the flexible polymer mesh is configured to extend around the housing wall in a ring and wherein the speaker is configured to emit the sound through the housing wall and the flexible polymer mesh; and
    electrical components mounted on the flexible polymer mesh.

12. The voice-controlled device defined in claim 11 wherein the housing wall has a surface region with compound curvature, wherein the flexible polymer mesh is configured to conform to the surface region of compound curvature and wherein the electrical components comprise light-emitting devices configured to form a display.

13. The voice-controlled device defined in claim 12 further comprising:
    a first fabric layer interposed between the flexible polymer mesh and the housing wall; and
    a second fabric layer, wherein the flexible polymer mesh is interposed between the second fabric layer and the first fabric layer.

14. The voice-controlled device defined in claim 13 wherein the light-emitting devices are configured to emit light that passes through the first fabric layer before passing through the second fabric layer.

15. The voice-controlled device defined in claim 14 further comprising at least one reflective acoustically transparent component-hiding layer interposed between the first fabric layer and the housing wall, wherein the reflective acoustically transparent component-hiding layer is configured to reflect the emitted light that passes through the first fabric layer back through the first fabric layer toward the flexible polymer mesh.

16. The voice-controlled device defined in claim 13 wherein the light-emitting devices are configured to emit light that passes through the second fabric layer without passing through the first fabric layer.

17. An electronic device, comprising:
    a flexible mesh substrate having support regions interconnected by substrate segments;
    a first layer of fabric that covers the flexible mesh substrate;
    circuitry on the support regions;
    a housing around which the flexible mesh substrate is wrapped;
    a second layer of fabric between the flexible mesh substrate and the housing; and a speaker in the housing, wherein the circuitry comprises light-emitting devices configured to form a display that displays images through the flexible mesh substrate.

18. The electronic device defined in claim 17 wherein the circuitry comprises a circuit selected from the group consisting of: an antenna circuit and a sensor circuit.

19. The voice-controlled device defined in claim 11 wherein the flexible polymer mesh overlaps an exterior surface of the housing wall.

20. The voice-controlled device defined in claim 11 wherein the housing wall has a plurality of openings that allow the sound to pass through the housing wall.

* * * * *